United States Patent [19]
Ramdani et al.

[11] Patent Number: 5,638,392
[45] Date of Patent: Jun. 10, 1997

[54] SHORT WAVELENGTH VCSEL

[75] Inventors: Jamal Ramdani, Gilbert; Michael S. Lebby, Apache Junction; Piotr Grodzinski, Chandler, all of Ariz.

[73] Assignee: Motorola, Schaumburg, Ill.

[21] Appl. No.: 441,270

[22] Filed: May 15, 1995

[51] Int. Cl.⁶ ................................................. H01S 3/19
[52] U.S. Cl. .............................. 372/45; 372/92; 372/96
[58] Field of Search ............................. 372/44, 45, 92, 372/96

[56] References Cited

U.S. PATENT DOCUMENTS

| | | | |
|---|---|---|---|
| 4,288,757 | 9/1981 | Kajimura et al. | 372/45 |
| 5,459,746 | 10/1995 | Itaya et al. | 372/46 |
| 5,526,190 | 6/1996 | Hubble, III et al. | 359/719 |

*Primary Examiner*—James W. Davie
*Attorney, Agent, or Firm*—Eugene A. Parsons

[57] ABSTRACT

A short wavelength vertical cavity surface emitting laser (101) is provided. A substrate (102) having a surface (103), wherein the substrate (102) includes gallium arsenide phosphide is formed. A first stack of mirrors (106) overlying the first surface (103) of the substrate (102) is formed. A first cladding region (107) is formed overlying the first stack of mirrors (106). An active region (108) is formed overlying the first cladding region (107). A second cladding region (109) is formed overlying the active region (108). A second stack of mirrors (110) is formed overlying the second cladding region (109). A contact region (126) is formed overlying the second stack of mirrors (110).

15 Claims, 2 Drawing Sheets

SHORT WAVELENGTH VCSEL

FIELD OF THE INVENTION

This invention relates, in general, to optical devices and, more particularly, to vertical cavity surface emitting lasers (VCSELs).

Background of the Invention

Conventional laser diodes are edge emitting devices that emit light parallel to a planar surface of the device. Additionally, conventional laser diodes emit light at long wavelengths. Since conventional laser diodes are edge emitting, packaging problems exist that make high volume manufacturing impractical, thus limiting utilization of this type of conventional laser diode. Further, since this type of conventional laser diode emits light with a long wavelength, applications that require shorter wavelengths are not capable of being achieved with this type of conventional laser diode.

Recently, there has been an increased interest in a new type of laser device called a vertical cavity surface emitting laser (VCSEL). Advantages of the VCSEL are that the device is smaller, planar, has lower power consumption, and is potentially more manufacturable. However, while the VCSEL offers these advantages, conventional VCSELs emit light having long wavelengths, thus not fulfilling the requirement for applications, such as high density Compact Disk (CD) Read Only Memory (ROM), and the like.

It can be readily seen that conventional methods of making VCSELs, as well as conventional articles have severe limitations. Also, it is evident that these conventional methods and articles are not only complex and expensive but also not amenable to high volume manufacturing. Therefore, a method and article for making a laser emitting at shorter wavelength that is highly manufacturable would be highly desirable.

DETAILED DESCRIPTION OF THE DRAWINGS

Figure 1:
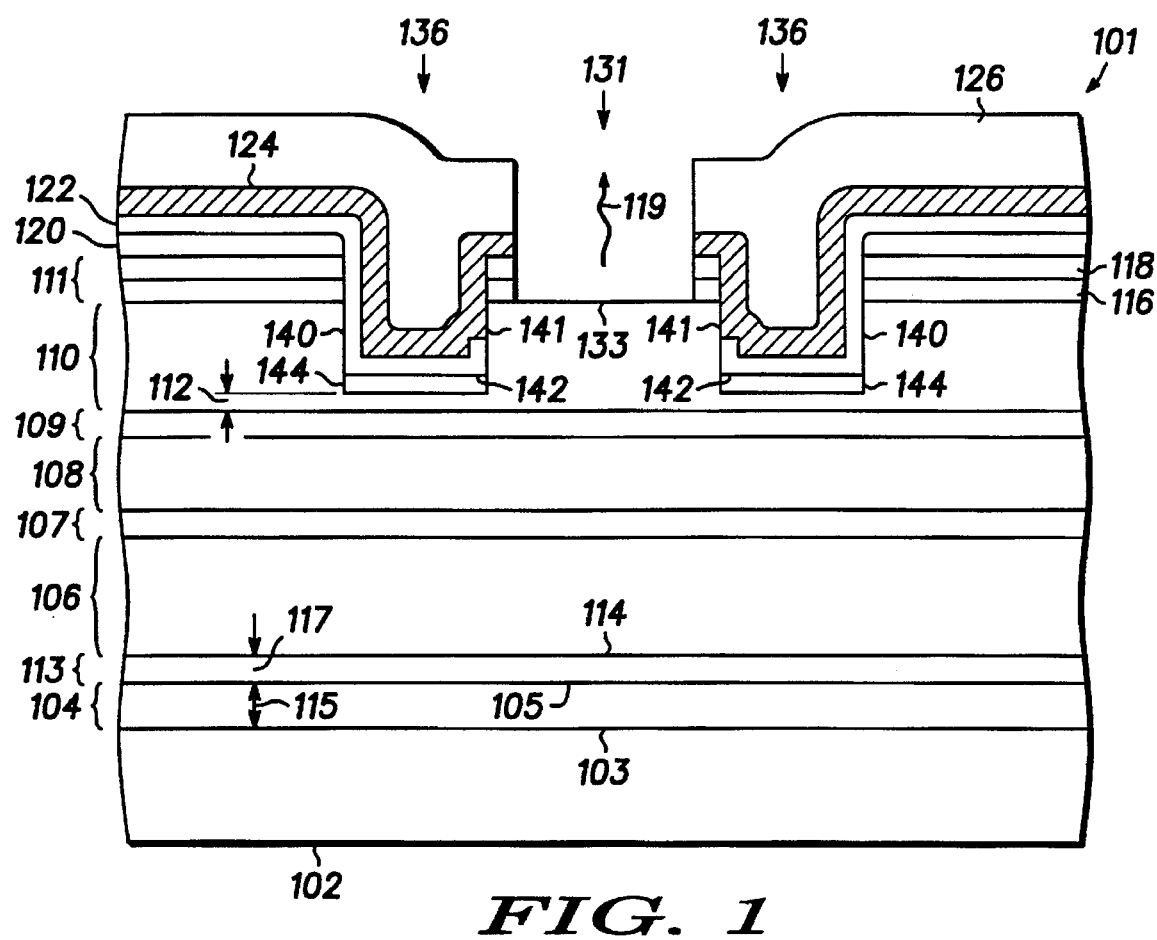
FIG. 1 illustrates a simplified sectional view of a vertical cavity surface emitting laser.
Figure 2:
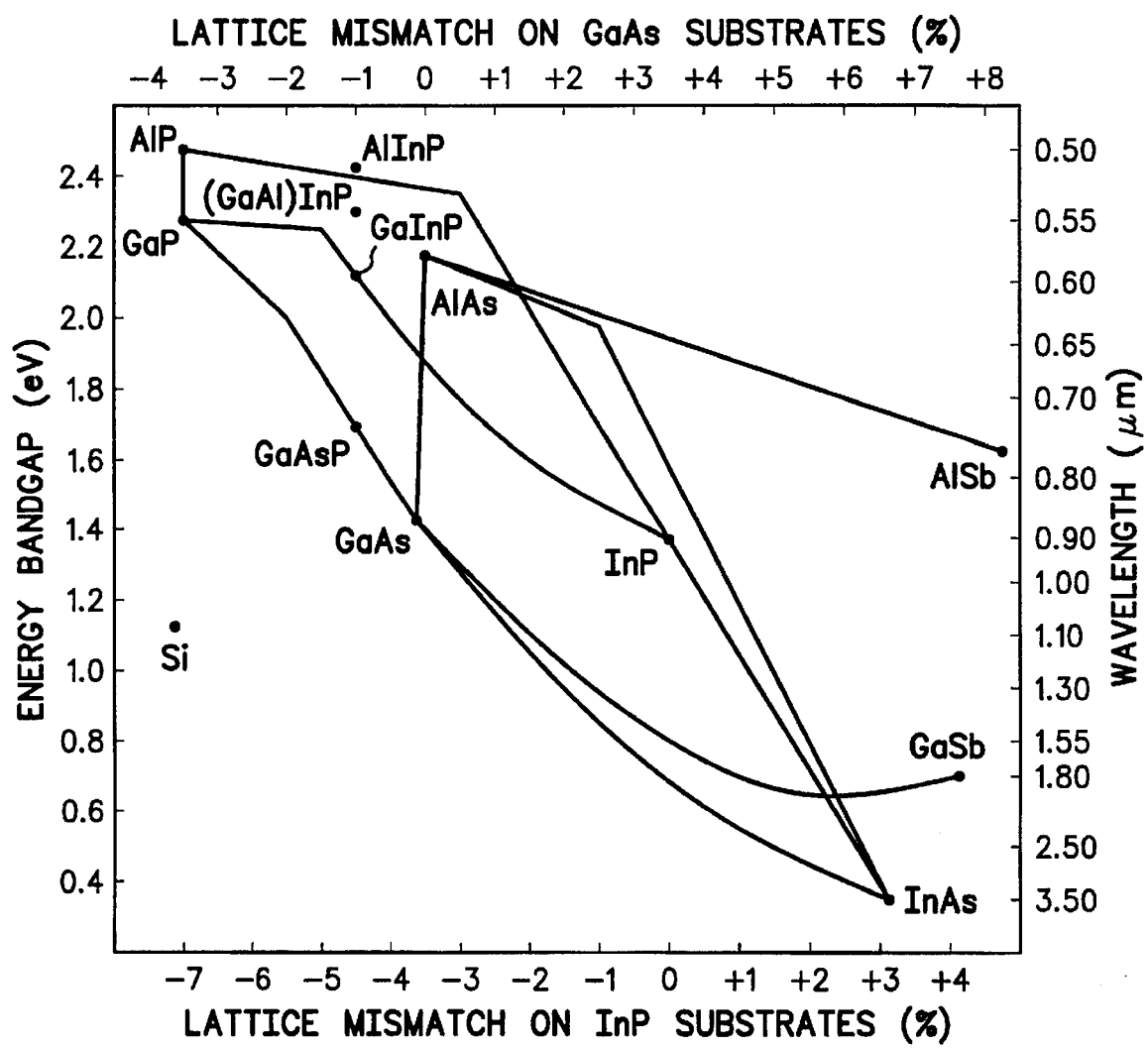
FIG. 2 is a graph illustrating material relationships between Lattice Mismatch on GaAs Substrates (%), Wavelength (um), Energy bandgap (eV), and Lattice Mismatch on InP Substrate (%).

Referring now to both FIGS. 1 and 2, FIG. 1 illustrates a partially fabricated greatly enlarged simplified sectional view of a vertical cavity surface emitting laser (VCSEL) 101 and FIG. 2 a graphical representation of several material characteristics, i.e., Lattice Mismatch on GaAs Substrates (%), Wavelength (um), Energy bandgap (eV), and Lattice Mismatch on InP Substrate (%) with associated materials.

VCSEL 101 is fabricated to include several features or elements, such as a substrate 102 having a surface 103, a graded layer 104 having surface 105, a pseudo-substrate 113 having a surface 114, a stack of distributed Bragg reflectors (DBRs) 106, a cladding region 107, an active region 108, a cladding region 109, a stack of DBRs 110, a contact region 111 including layers 116 and 118, a layer 120, a layer 122, a conductive layer 124, a contact 126, a mesa or a ridge 131 having a surface 133, a trench 136 having surfaces 140, 141, 142, and a region 144.

It should be understood that FIG. 1 only shows a sectional view of a portion of substrate 102, thereby enabling FIG. 1 to continue into and out of the drawing, as well as being able to extend laterally across the drawing. Thus, VCSEL 101 can represent one of a plurality of VCSELs that make an array. The present patent application is related to a copending patent application bearing Attorney Docket number CR94-107 entitled METHOD FOR MAKING A VCSEL, filed on Nov. 29, 1994, having Ser. No. 08/346,558 and assigned to the same assignee which is hereby incorporated by reference herein.

For the purpose of orienting the reader, a brief description of materials and methods is provided hereinbelow. Briefly, VCSEL 101 is fabricated on any suitable substrate 102 material, such as gallium arsenide (GaAs), indium gallium phosphide ($InGa_{1-x}P_x$), gallium arsenide phosphide ($GaAs_{1-x}P_x$), or the like having surface 103, wherein the substrate is defined either as any suitable bulk material or any suitable supporting material layer. As shown in FIG. 1, substrate 102 is shown as bulk material.

Graded layer 104 having surface 105 is deposited or disposed by any suitable epitaxial method or technique, such as vapor phase epitaxy (VPE), molecular beam epitaxy (MBE), metal-organic chemical vapor deposition (MOCVD), or the like. Graded layer 104 is made of any suitable material, such as GaAsP, or the like. Generally, graded layer 104 is fabricated to facilitate a transition from a first crystal lattice constant to a second crystal lattice constant. By way of example, with substrate 102 being gallium arsenide having a first crystal lattice constant of 5.653 Angstroms, with pseudo-substrate 113 being $GaAs_{.70}P_{.30}$ having a second crystal lattice of 5.593 Angstroms, a mismatch of 1.1 percent is formed between substrate 102 and pseudo-substrate 113 (as shown in FIG. 2). Graded layer 104 being $GaAs_{1-x}P_x$ provides a transition between the first crystal lattice constant and the second crystal lattice constant by epitaxially depositing $GaAs_{1-x}P_x$ with an increasing phosphorus concentration (x) to the desired amount. In this specific example, phosphorus concentration is 30 percent with a corresponding arsenic concentration of 70 percent. Additionally, graded layer 104 blocks the penetration of misfit dislocations and other defects into subsequent epi-layers, thereby providing surface 105 having a low defect density.

Generally, any suitable method or technique, such dynamically varying arsenic and phosphorus concentration values from 0.0 to 70 and 0 to 30 percent, respectively, layering sequential film with varying arsenic and phosphorus concentration, and the like can be used for depositing graded layer 104, thereby providing a crystal lattice bridge from one material to another material. Graded layer 104 can be any suitable thickness 115 ranging from 0.1 to 50.0 microns, with a preferred range from 0.5 to 20 microns, and a nominal thickness of 1.0 micron. However, it should be understood that if substrate 102 is made of $GaAs_{1-x}P_x$ graded layer 104 is not necessary, thus enabling the stack of DBRs 106 to be fabricated directly on the GaAsP substrate 102.

Pseudo-substrate 113 having surface 114 is subsequently deposited or disposed on graded layer 104, thereby providing a material layer for subsequent fabrication of VCSEL 101. Any suitable epitaxial method or technique, such as vapor phase epitaxy (VPE), molecular beam epitaxy (MBE), metal-organic chemical vapor deposition (MOCVD), or the like can be used. However, in a preferred embodiment of the present invention, VPE is used to deposit pseudo-substrate 113 on graded layer 104. Generally, pseudo-substrate 113 is made of the same material as graded layer 104, but using a final composition of graded layer 104, thereby crystal lattice matching pseudo-substrate 113 with graded layer 104. By way of example, with graded layer 104 being graded from GaAs to GaAs$_{.70}$P$_{.30}$, pseudo-substrate 113 also made of GaAs$_{.70}$P$_{.30}$. It should be understood that while pseudo-substrate 113 and graded layer 104 are described as being separated entities, pseudo-substrate 113 is a seamless continuation of graded layer 104. Additionally, it should be understood that concentrations for arsenic and phosphorus can range from 60 to 80 percent and from 20 to 40 percent, with a preferred range from 65 to 75 percent and 25 to 35 percent, with nominal values on the order of 70 and 30 percent, respectively. Pseudo-substrate 113 can be any suitable thickness 117 ranging from 0.1 micron or greater; however, practically speaking, thickness 117, can range from 0.1 to 50 microns, with a preferred range from 10.0 to 100.0 microns, and a nominal thickness on the order of 50.0 microns. By providing pseudo-substrate 113, a new and different substrate material is formed having different crystal lattice constant, as well as an elevated bandgap, as shown in FIG. 2. Thus, pseudo-substrate 113 provides a platform for fabricating VCSEL 101 with a substantially shorter emission wavelength. As can be seen in FIG. 2, GaAs$_{.70}$P$_{.30}$ has a bandgap of approximately 1.75 eV, thereby enabling shorter emission wavelengths on the order of 0.7 μm which are in the visible spectrum.

Once pseudo-substrate 113 has been deposited on substrate 102, several epitaxial layers including the stack of DBRs 106, cladding region 107, active region 108, cladding region 109, and the stack of DBRs 110 are deposited or formed overlying substrate 102. Generally, these layers are sequentially disposed or deposited on top of each other by any suitable method or technique, such as vapor phase epitaxy (VPE), molecular beam epitaxy (MBE), metal organic chemical vapor deposition, or the like.

More specifically, regarding materials for DBRs 106 and 110, cladding regions 107 and 109, and active region 108, it should be understood that any suitable material set can be used to fabricate the above mentioned layers. However, by selecting materials suitable with pseudo-substrate 113 being GaAs$_{.70}$P$_{.30}$, VCSEL 101 is fabricated having an emission wavelength ranging from 0.55 to 0.7 μm, thereby providing light 119 from VCSEL 101 with a substantially shorter wavelength.

By way of example, with pseudo-substrate 113 being GaAs$_{.70}$P$_{.30}$, active region 108 is made of several layers including barrier layer of (GaAl)$_y$In$_{1-y}$P barrier layers and quantum well of Ga$_y$In$_{1-y}$P. It should be understood that multiple quantum wells and barrier layers are used. Generally, in the present example, accounting for increased energy transition and providing enough bandgap discontinuity, values for y are on the order of 65 percent; however, it should be understood that these values change depending upon the specific application and construction of materials.

Cladding regions 107 and 109 are made of aluminum indium phosphide (Al$_y$In$_{1-y}$P) which are positioned on either side of active region 108 and doped appropriately. As in active region 108, the y value is similar to that of cladding region 109.

DBR's 106 and 110 are made of alternating layers of Al$_y$In$_{1-y}$P/(AlGa)$_y$In$_{1-y}$P, wherein DBR 106 is n-doped and DBR 110 is p-doped. Generally, with pseudo-substrate 113 being GaAs$_{.70}$P$_{.30}$, the y value is on the order of 65 percent.

Contact region 111 is made to include layers 116 and 118, wherein layer 116 is an epitaxially deposited material, such as gallium arsenide that is p-doped, e.g., doped with zinc, and wherein layer 118 is an ohmic metal material, such as a metal, e.g., titanium, tungsten, or the like, or an alloy, such as titanium/tungsten.

Mesa 131 and trench 136 are formed by any suitable process or combination of processes, such as deposition, photolithography, etching, or the like. Generally, layer 120 is deposited on contact region 111. Layer 120 is made of any suitable material, such as nitride, oxynitride, silicon dioxide, or the like. A mask layer is then applied to layer 120. The mask layer is made of any suitable photoactive material, such as photoresist, polyimide, or the like. The mask layer is then patterned with a ring formation, thereby exposing portions of layer 120 and covering other portions of layer 120. The exposed portions of layer 120 are then etched or removed by any suitable method, such as a dry etch method, a wet etch method, or the like. Once the exposed portions of layer 120 are removed, portions of contact region 111 subsequently are exposed and etched, thereby removing or etching the exposed portions of contact region 111. Etching is continued until a desired depth is obtained, thereby transferring the ring pattern through contact region 111 and at least into DBRs 110 to make mesa or ridge 131 and trench 136.

Patterning of the mask layer is achieved by any suitable method well known in the art, such as photolithography. Additionally, it should be understood that as the etching of trench 136 continues, a continuous surface, indicated as surfaces 140, 141, and 142 is formed. However, it should be understood that variations of process parameters and equipment can produce trench 136 in a variety of geometric configurations, such a squared channel, a U-groove, a V-groove, or the like. While etching of trench 136 can be continued through the stack of DBRs 106 to surface 103 of substrate 102, in a preferred embodiment of the present invention, etching of trench 136 is continued until a distance 112 is reached in DBRs 110. Distance 112 is defined from cladding region 109 to surface 142 of trench 136. Typically, distance 112 can be any suitable distance; however, in a preferred embodiment of the present invention, distance 112 is less than 1.0 micron, with a nominal distance of less than 0.1 micron.

For example, with layer 120 being made of nitride, with layer 118 being made of titanium/tungsten, and with layer 116 being made of gallium arsenide, layers 120 and 118 are etched in a fluorine based plasma chemistry and layer 116 is etched with a chlorine based chemistry.

Region 144 illustrates a current confinement region that is optionally formed in the stack of DBRs 110 for specific applications of VCSEL 101. Generally, region 144 is formed by any suitable method, such as ion implantation of any suitable ion, such as hydrogen, oxygen, or the like that disrupts epitaxial stacking of atoms in region 144, thereby inhibiting lateral spreading of current, thereby improving performance of VCSEL 101.

Once mesa 131 and trench 136 are properly formed, a layer 122 of any suitable dielectric material, such as silicon dioxide, nitride, oxynitride, or the like is deposited on layer 120, trench 136, and mesa 131. A masking layer similar to that previously described is then applied to layer 122 and patterned, thereby exposing a portion of layer 122 above surface 133 of mesa 131. Generally, patterning of the masking layer is achieved so that the portion of layer 122 above surface 133 of mesa 131 is fully exposed, while trench 136 and other portions of layer 122 are covered and protected by the masking layer. Layer 122 and any remaining material of layer 120 is then etched away or removed by any suitable method which has been described hereinabove.

Thus, removing portions of layer 122 and 120 exposed on mesa 131 and exposing surface 133 of mesa 131.

After etching layers 120 and 122 has been completed, conductive layer 124 is deposited or disposed on the structure by any suitable method, such as evaporation, sputtering, or the like. Conductive layer 124 is made of any suitable conductive material, such as a metal, e.g., aluminum, copper, titanium, tungsten, or the like, an alloy, e.g., aluminum/copper, titanium/tungsten, or the like.

After the deposition of conductive layer 124, contact 126 is formed on conductive layer 124 by any suitable method, such as sputtering, evaporating, or the like. Generally, contact 126 can be made of any suitable material, such as a metal, e.g., nickel, gold, titanium, tungsten, or the like, an alloy, e.g., titanium/tungsten, or the like, thereby enabling selective plating onto these materials. However, in a preferred embodiment of the present invention, a gold material that is sputtered on conductive layer 124 is used.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

By now it should be appreciated that a novel article and method for making a short wavelength VCSEL has been provided. The VCSEL emits visible light from 0.55 to 0.7 μm, thereby enabling VCSEL to emit light at a significantly shorter wavelength than commonly fabricated devices on GaAs substrates.

What is claimed is:

1. A short wavelength vertical cavity surface emitting laser comprising:

a gallium arsenide phosphide substrate having a surface;

a first stack of mirrors disposed on the surface of the gallium arsenide phosphide substrate;

a first cladding region disposed on the first stack of mirrors;

an active region disposed on the first cladding region;

second cladding region disposed on the active region;

a second stack of mirrors disposed on the second cladding region; and a contact region disposed on the second stack of mirrors.

2. A short wavelength vertical cavity surface emitting laser as claimed in claim 1 wherein the gallium arsenide phosphide substrate includes an arsenic concentration ranging from 60–80 percent.

3. A short wavelength vertical cavity surface emitting laser as claimed in claim 1 wherein the gallium arsenide phosphide substrate includes a phosphorus concentration ranging from 20–40 percent.

4. A short wavelength vertical cavity surface emitting laser comprising:

a semiconductor substrate having a first surface;

a gallium arsenide phosphide layer deposited on the surface of the semiconductor substrate;

a first stack of mirrors overlying the first surface of the semiconductor substrate;

a first cladding region overlying the first stack of mirrors;

an active region overlying the first cladding region;

a second cladding region overlying the active region;

a second stack of mirrors overlying the second cladding region; and a contact region overlying the second stack of mirrors.

5. A short wavelength vertical cavity surface emitting laser as claimed in claim 4 wherein the gallium arsenide phosphide layer composition includes arsenic concentration ranging from 60–80 percent.

6. A short wavelength vertical cavity surface emitting laser as claimed in claim 4 wherein the gallium arsenide phosphide layer includes phosphorus concentration ranging from 20–40 percent.

7. A short wavelength vertical cavity surface emitting laser as claimed in claim 4 wherein the gallium arsenide phosphide layer composition includes arsenic and phosphorus concentrations ranges are nominally 70 percent and from 30 percent.

8. A short wavelength vertical cavity surface emitting laser as claimed in claim 4 wherein the semiconductor substrate is gallium arsenide.

9. A short wavelength vertical cavity surface emitting laser as claimed in claim 4 wherein the semiconductor substrate is GaAsP.

10. A short wavelength vertical cavity surface emitting laser with a pseudo-substrate comprising:

a semiconductor substrate having a first surface;

a graded layer having a surface deposited on the surface of the semiconductor substrate;

a pseudo-substrate deposited on the surface of the graded layer;

a first stack of mirrors overlying the first surface of the semiconductor substrate;

a first cladding region overlying the first stack of mirrors;

an active region overlying the first cladding region;

a second cladding region overlying the active region;

a second stack of mirrors overlying the second cladding region; and a contact region overlying the second stack of mirrors.

11. A short wavelength vertical cavity surface emitting laser as claimed in claim 10 wherein the pseudo-substrate includes an arsenic concentration ranging from 60–80 percent.

12. A short wavelength vertical cavity surface emitting laser as claimed in claim 10 wherein the pseudo-substrate includes phosphorus concentration ranging from 20–40 percent.

13. A short wavelength vertical cavity surface emitting laser as claimed in claim 10 wherein the pseudo-substrate includes arsenic and phosphorus concentrations nominally at 70 percent and from 30 percent, respectively.

14. A short wavelength vertical cavity surface emitting laser as claimed in claim 10 wherein the semiconductor substrate is gallium arsenide.

15. A short wavelength vertical cavity surface emitting laser as claimed in claim 10 wherein the semiconductor substrate is GaAsP.

\* \* \* \* \*